United States Patent
Jeong et al.

(10) Patent No.: US 9,278,490 B2
(45) Date of Patent: Mar. 8, 2016

(54) METHOD FOR MANUFACTURING A TWO-DIMENSIONAL POLYMER OPTICAL WAVEGUIDE

(75) Inventors: Myung Yung Jeong, Busan (KR); Chang Seok Kim, Busan (KR); Jin Hwa Ryu, Ulsan (KR); Seung Hun Oh, Busan (KR); Tae Ho Lee, Busan (KR); Sang Uk Cho, Gyeongsangnamdo (KR)

(73) Assignee: Pusan National University Industry-University Cooperation Foundation, Pusan (KR)

( * ) Notice: Subject to any disclaimer, the term of this patent is extended or adjusted under 35 U.S.C. 154(b) by 583 days.

(21) Appl. No.: 13/699,363

(22) PCT Filed: Dec. 31, 2010

(86) PCT No.: PCT/KR2010/009634
§ 371 (c)(1),
(2), (4) Date: Nov. 21, 2012

(87) PCT Pub. No.: WO2011/149175
PCT Pub. Date: Dec. 1, 2011

(65) Prior Publication Data
US 2013/0062799 A1    Mar. 14, 2013

(30) Foreign Application Priority Data

May 24, 2010    (KR) .................... 10-2010-0048077

(51) Int. Cl.
| | |
|---|---|
| *B29D 11/00* | (2006.01) |
| *G02B 6/122* | (2006.01) |
| *G02B 6/138* | (2006.01) |
| *G03F 7/00* | (2006.01) |
| *B82Y 10/00* | (2011.01) |
| *B82Y 40/00* | (2011.01) |

(52) U.S. Cl.
CPC .......... *B29D 11/00663* (2013.01); *B82Y 10/00* (2013.01); *B82Y 40/00* (2013.01); *G02B 6/1221* (2013.01); *G02B 6/138* (2013.01); *G03F 7/0002* (2013.01)

(58) Field of Classification Search
CPC .......... B29D 11/00663; G02B 6/1221; G02B 6/138; G03F 7/0002
USPC ....................................................... 264/1.24
See application file for complete search history.

(56) References Cited

FOREIGN PATENT DOCUMENTS

| JP | 08-313747 A | 11/1996 |
|---|---|---|
| JP | 2004-188822 A | 7/2004 |
| KR | 10-0914996 B1 | 9/2009 |

OTHER PUBLICATIONS

Machine Translation of JP 2004188822.*

*Primary Examiner* — Christopher Schatz
(74) *Attorney, Agent, or Firm* — Paratus Law Group, PLLC

(57) ABSTRACT

The present invention relates to a method for manufacturing a two-dimensional polymer optical waveguide, which is used for manufacturing a two-dimensional optical waveguide through simplified processes using a single imprint original master. The method includes: replicating a pattern through a first hot-embossing process on a thermoplastic polymer sheet using a single original master; forming a buffer layer on the surface of the replicated pattern; manufacturing a polymer mold having a cladding pattern on the other side without a buffer layer through a second hot-embossing process using the original master; replicating a pattern by molding the polymer mold out of an elastic material and forming an upper elastic mold and a lower elastic mold by vertically separating the elastic material; and forming middle cladding using the upper and lower elastic molds, filling regions on and below the middle cladding with core resin patterns, and performing a curing process after stacking upper and lower cladding to form a two-dimensional optical waveguide.

7 Claims, 9 Drawing Sheets

*-Prior Art-*

*-Prior Art-*

*-Prior Art-*

De-Embossing

*-Prior Art-*

Core filling

*-Prior Art-*

METHOD FOR MANUFACTURING A TWO-DIMENSIONAL POLYMER OPTICAL WAVEGUIDE

CROSS REFERENCE TO PRIOR APPLICATIONS

This application is a National Stage Patent Application of PCT International Patent Application No. PCT/KR2010/009634 (filed on Dec. 31, 2010) under 35 U.S.C. §371, which claims priority to Korean Patent Application No. 10-2010-0048077 (filed on May 24, 2010), which are all hereby incorporated by reference in their entirety.

TECHNICAL FIELD

The present invention relates to a method for manufacturing a two-dimensional polymer optical waveguide, and more specifically, to a method for manufacturing a two-dimensional polymer optical waveguide which may be used for manufacturing a two-dimensional optical waveguide through a simplified process using a single imprint original master.

BACKGROUND ART

An optical waveguide is a field which has been actively studied in a next generation communication system for a fast transmission of massive information.

In order to manufacture a highly integrated optical waveguide, a process for manufacturing a planar optical waveguide has been actively studied. In order to find a solution for the highly integrated optical waveguide, a process for manufacturing a two-dimensional optical waveguide has been studied.

Among process techniques for manufacturing a planar optical waveguide, an imprinting process is a method for transcribing a pattern onto a polymer layer using a mold having a micro structure. A direct transcription technique of a pattern causes mass replication of a micro structure to be possible with a simple process, a short process time and a low process cost, thereby having a considerable advantage over the other processes.

A study for manufacturing a two-dimensional optical waveguide by the imprinting process is implemented by using two imprint molds. Specifically, according to the study for manufacturing a two-dimensional optical waveguide, a clad polymer layer is inserted between two imprint molds, and then an intermediate clad is manufactured.

Hereinafter, a process for manufacturing a planar optical waveguide will be described.

FIGS. 1 to 5 are sectional views of a process for manufacturing an optical waveguide using a conventional hot-embossing process.

A planar optical waveguide is generally manufactured by means of a photo lithography process.

The process for manufacturing an optical waveguide using a photo lithography process is composed of the steps of: (1) coating a silicon wafer of a quartz wafer with an adhesion promoter for enhancing an adhesion effect between a wafer and a polymer; (2) coating an upper surface of the adhesion promoter with a lower clad of a polymer resin once again and curing it; (3) coating the lower clad with a polymer core resin having a refractive index higher than that of the lower clad and curing it; (4) coating the polymer core resin with another photosensitive polymer (photoresist) and soft-baking it; (5) exposing the photoresist using a photo mask; (6) baking (post exposure baking) an exposed pattern in the photoresist; (7) developing the pattern of the photoresist and baking (hard baking) it; (8) etching a core layer using the photoresist as an etching mask; (9) removing the photoresist pattern remaining on the core pattern; and (10) manufacturing an upper clad of the same polymer resin as the lower clad on the core pattern.

A process for a more simplified process, a lower cost and shorter process steps to manufacture the same optical waveguide has been actively studied, and an imprinting process is one of the processes which have been in the limelight among others.

The imprinting process is composed of the steps of (1) manufacturing a lower clad on a polymer layer using a mold having a micro-pattern; (2) filling an inside of a pattern of the lower clad with a core; and (3) completing an optical waveguide by manufacturing an upper clad.

A detailed method for manufacturing an optical waveguide using an imprinting process will be illustrated with reference to FIGS. 1 to 5.

First of all, as shown in FIGS. 1 and 2, an imprint mold 11 is used to form a lower clad 12a having a core structure on a polymer layer 12.

At this time, the imprinting process for manufacturing the lower clad may be classified into a hot-embossing technique in which mobility of a polymer due to an increase in temperature is used to manufacture the lower clad, and an ultraviolet embossing technique in which an ultraviolet curable polymer is used to manufacture the lower clad.

Then, as shown in FIG. 3, the lower clad 12a and the imprint mold 11 are separated from each other.

As shown in FIG. 4, a core channel of the lower clad 12a is filled with a core resin 14, i.e., a polymer resin having a refractive index higher than that of the lower clad 12a.

Then, as shown in FIG. 5, the upper clad 13 is stacked, and the core resin is cured by ultraviolet to complete the optical waveguide.

The method for manufacturing the optical waveguide as described above is a representative method for manufacturing an optical waveguide.

Hereinafter, a method for manufacturing a two-dimensional optical waveguide in connection with the method for manufacturing the optical waveguide as described above will be described as follows.

A method for manufacturing a two-dimensional polymer optical waveguide by a photolithography process sequentially repeats once more the method for manufacturing the optical waveguide as described above.

Accordingly, repetitive and complicated processes require a long process time.

In addition, a method for manufacturing a two-dimensional optical waveguide by an imprinting process is implemented through a study for various processes. Specifically, two imprint molds are used according to a study for manufacturing a two-dimensional optical waveguide, wherein a clad polymer layer is inserted between the two imprint molds and then an intermediate clad is manufactured.

However, the molds required in the imprinting process are manufactured of a material, such as silicon, nickel, quartz, or the like by a process of electron beam lithography or optical lithography.

Accordingly, there is a connotation of a limitation concerning a higher process cost for manufacturing an imprint mold.

In order to resolve the above-mentioned problem, a technique for manufacturing a two-dimensional optical waveguide in a simple manner and in a short process time using a single imprint mold has been urgently required.

DISCLOSURE

Technical Problem

The present invention is to resolve the problem found in the conventional process for manufacturing an optical waveguide as described above. An object of the present invention is to provide a method for manufacturing a two-dimensional polymer optical waveguide which may be used for manufacturing a two-dimensional optical waveguide through simplified processes using a single imprint original master.

Another object of the present invention is to manufacture a two-dimensional optical waveguide which may realize higher density and integration of the optical waveguide using a single imprint mold.

A further object of the present invention is to provide a method for manufacturing an imprint mold capable of manufacturing a two-dimensional optical waveguide which is required to manufacture the two-dimensional optical waveguide by an imprinting process in a simple manner and in a short time.

The objects of the present invention are not limited to the aforementioned ones, and the other objects which are not described above may be apparently understood by a skilled person in the art from the following descriptions.

Technical Solution

According to the present invention for achieving the objects, there is provided a method for manufacturing a two-dimensional polymer optical waveguide, which includes the steps of: replicating a pattern on a thermoplastic polymer sheet through a first hot-embossing process using a single original master; forming a buffer layer on the surface of the replicated pattern; manufacturing a polymer mold having a cladding pattern on the other surface having no buffer layer formed thereon through a second hot-embossing process using the original master; forming an upper elastic mold and a lower elastic mold by molding the polymer mold out of an elastic material to replicate the pattern and vertically separating the elastic material; forming an intermediate clad using the upper and lower elastic molds; and forming a two-dimensional optical waveguide by filling upper and lower patterns of the intermediate clad with a core resin, stacking upper and lower clads, and then performing a curing process.

In addition, the step of replicating a pattern on a thermoplastic polymer sheet through a first hot-embossing process may include forming a polymer pattern through the first hot-embossing process using the original master and a PMMA (polymethyl methacrylate) sheet as the thermoplastic polymer sheet.

Further, in the step of forming a buffer layer, a PDMS (polydimethylsiloxane) mold may be stacked on the surface of the replicated pattern and used as the buffer layer to control deformation of the pattern replicated through the hot-embossing process.

Furthermore, the step of manufacturing a polymer mold may include performing the second hot-embossing process by the original master on a surface of a PMMA sheet having no buffer layer thereon, and in this step, an alignment key within the original master and an alignment key within the pattern replicated through the first hot-embossing process are used to control an interlayer position precision.

Furthermore, the step of forming an upper elastic mold and a lower elastic mold may include the steps of: forming an elastic mold by molding the polymer mold out of PMMA; forming the upper elastic mold by severing only an upper region from a region in which the polymer mold exists within the elastic mold and attaching the severed portion of the elastic mold to another PDMA sheet or a glass plate; and forming the lower elastic mold by separating the polymer mold from the remaining lower elastic mold.

Moreover, the thickness of the intermediate clad of the final two-dimensional polymer optical waveguide may depend on the thickness between upper and lower surfaces of the elastic mold determined in the step of forming an elastic mold.

Further, the step of forming an intermediate clad may include the steps of: filling a cavity of the lower elastic mold with an ultraviolet curable resin and covering the lower elastic mold with the upper elastic mold to bond the upper and lower elastic molds; exposing the bonded upper and lower elastic molds to ultraviolet; and separating the ultraviolet curable resin from the upper and lower elastic molds if the ultraviolet curable resin in a liquid state is cured to a solid state by the ultraviolet exposure process.

Furthermore, in the step of forming a two-dimensional optical waveguide, respective core regions on both surfaces of the intermediate clad may be filled with an ultraviolet curable resin having a refractive index higher than that of the intermediate clad, upper and lower clads having a refractive index equal to that of the intermediate clad may be stacked on the upper and lower surfaces of the intermediate clad, respectively; and then the curing process may be performed.

Moreover, the polymer mold may be directly used as the intermediate clad for manufacturing the two-dimensional polymer optical waveguide so that a filling process of core channels on both surfaces of the polymer mold with a core resin is performed, and upper and lower clads may be stacked to form the two-dimensional polymer optical waveguide.

Advantageous Effects

The method for manufacturing a two-dimensional polymer optical waveguide as described above has effects as follows:

First, it is possible to manufacture a two-dimensional optical waveguide which may realize higher density and integration of the optical waveguide using a single imprint mold.

Second, one imprint mold may be sufficient in place of two imprint molds which should have been required to manufacture a two-dimensional optical waveguide which is manufactured in an imprinting process basis.

Third, a two-dimensional optical waveguide may be manufactured in a simple method by manufacturing a polymer mold having cladding patterns on both the surfaces thereof.

BEST MODE

Hereinafter, preferred embodiments of a method for manufacturing a two-dimensional polymer optical waveguide according to the present invention will be described in detail as follows.

The features and advantages of the method for manufacturing a two-dimensional polymer optical waveguide according to the present invention will be apparent through the detailed description of respective embodiments as described below.

FIGS. 6 to 11 are sectional views showing a polymer mold process for manufacturing a two-dimensional polymer optical waveguide according to the present invention.

The method for manufacturing a two-dimensional polymer optical waveguide according to the present invention may be used for manufacturing a two-dimensional optical waveguide through simplified processes using a single imprint original master.

A process for manufacturing a polymer mold to manufacture a two-dimensional optical waveguide according to an embodiment of the present invention is performed with a hot-embossing process using an original master 20 and a PMMA (polymethyl methacrylate) sheet 30 as a thermoplastic polymer sheet.

Figure 1:
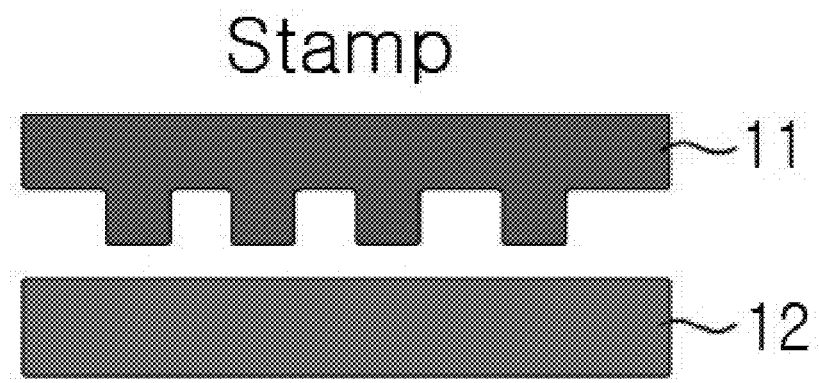
FIGS. 1 to 5 are sectional views of a process for manufacturing an optical waveguide using a conventional hot-embossing process.
Figure 2:
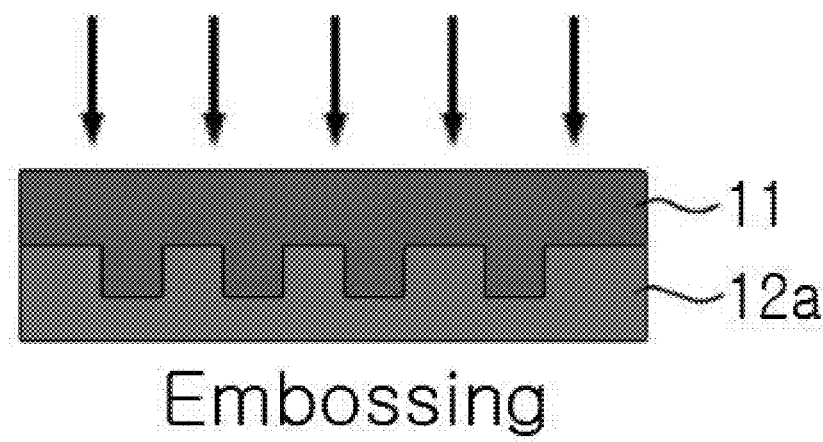
Figure 3:
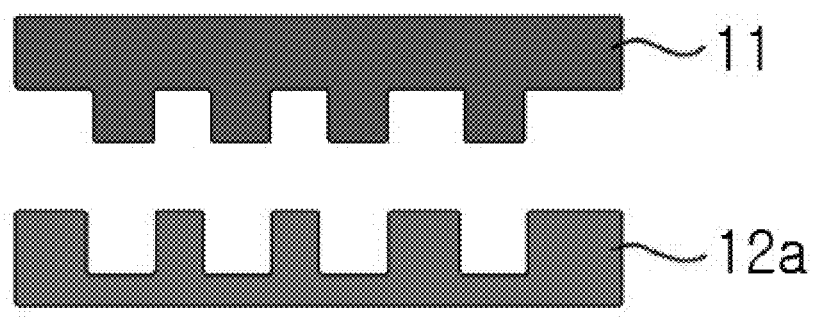
Figure 4:
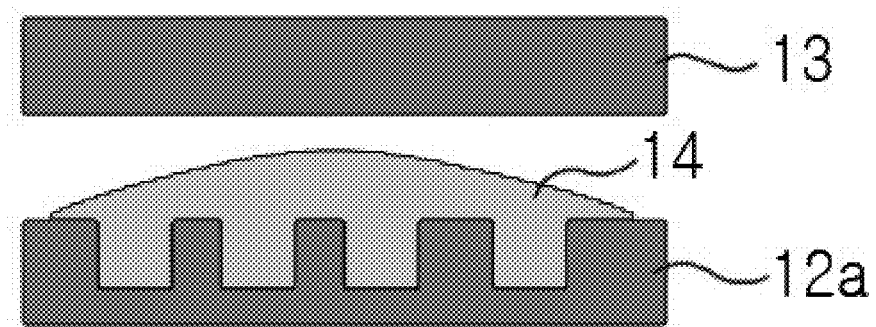
Figure 5:
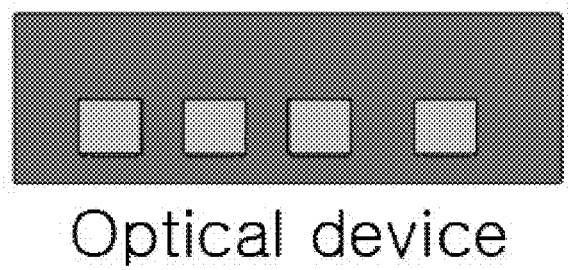
Figure 6:
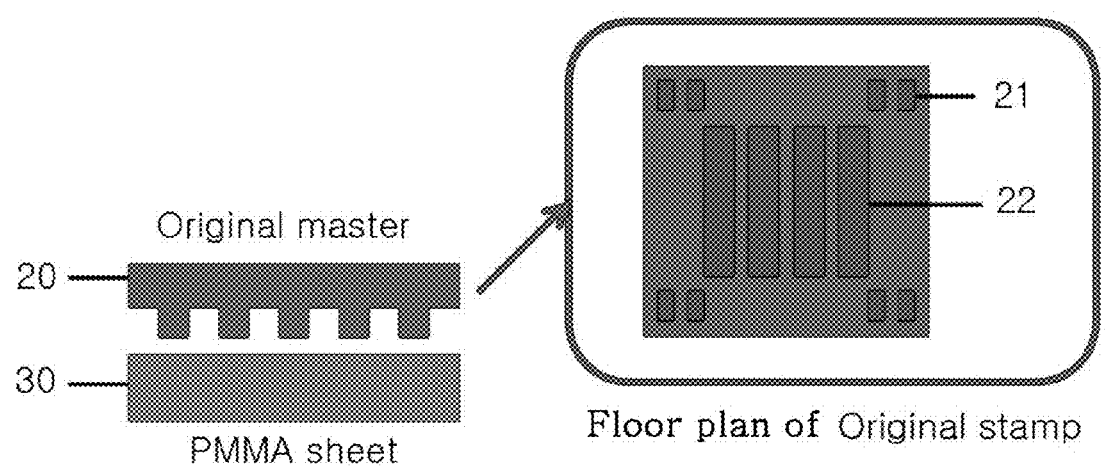
FIGS. 6 to 11 are sectional views showing a polymer mold process for manufacturing a two-dimensional polymer optical waveguide according to the present invention.
Figure 7:
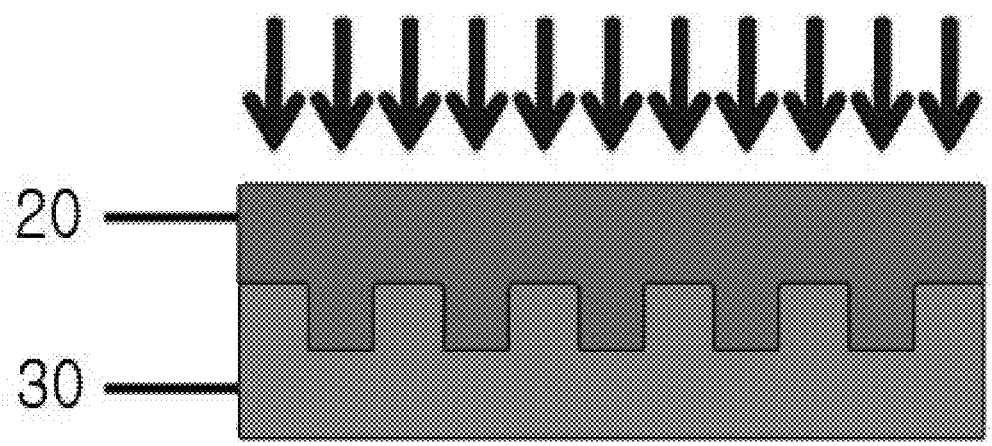
Figure 8:
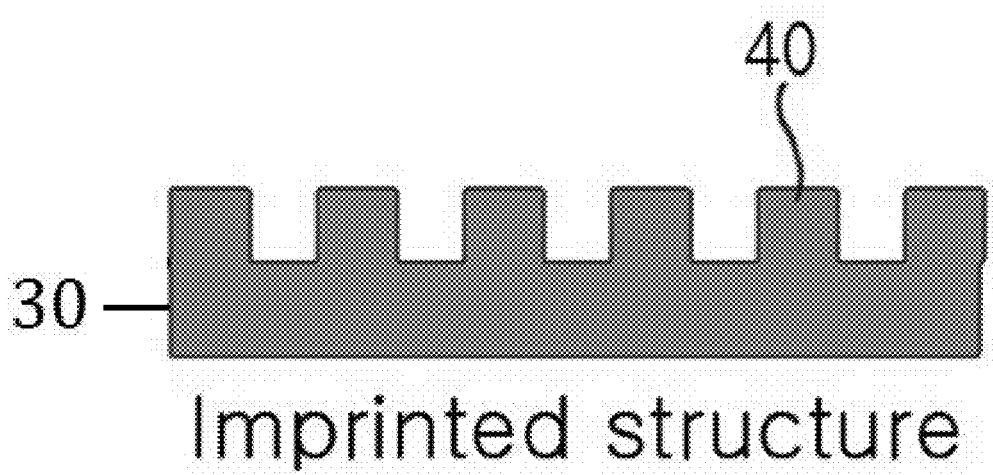

First of all, as shown in FIGS. 6 and 7, the original master 20 and the PMMA sheet 30 are used to perform a first hot-embossing process, so that a polymer pattern 40 is formed as shown in FIG. 8.

Here, referring to a planar structure of the original master 20 shown in FIG. 6, there is an alignment key 21 outside a region of a pattern 22 for manufacturing a clad.

The alignment key 21 is used to perform an interlayer position control for manufacturing the two-dimensional optical waveguide later.

Figure 9:
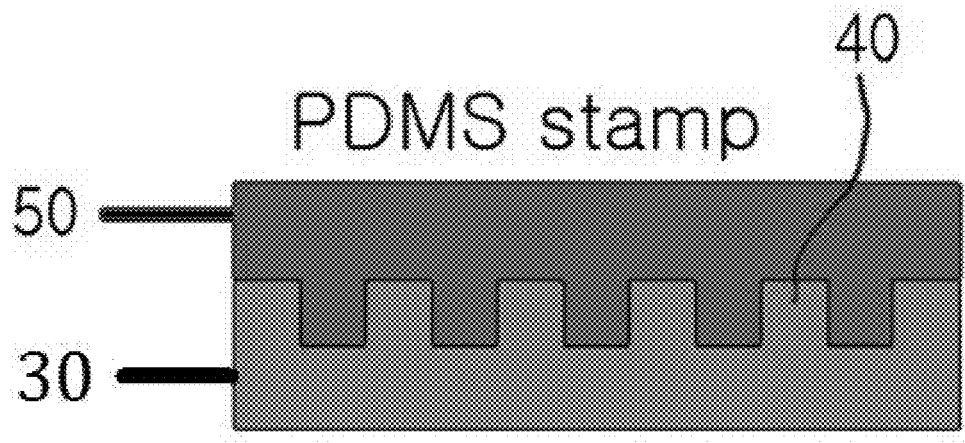

Then, as shown in FIG. 9, in order to control the pattern deformation of the polymer pattern 40 manufactured through the hot-embossing process, a PDMS (polydimethylsiloxane) mold is manufactured on the surface of the polymer pattern 40 to form the buffer layer.

Here, the PDMS mold manufactured as the buffer layer 50 is to control the deformation of the initially manufactured pattern in the next step of a double-faced hot-embossing process.

Figure 10:
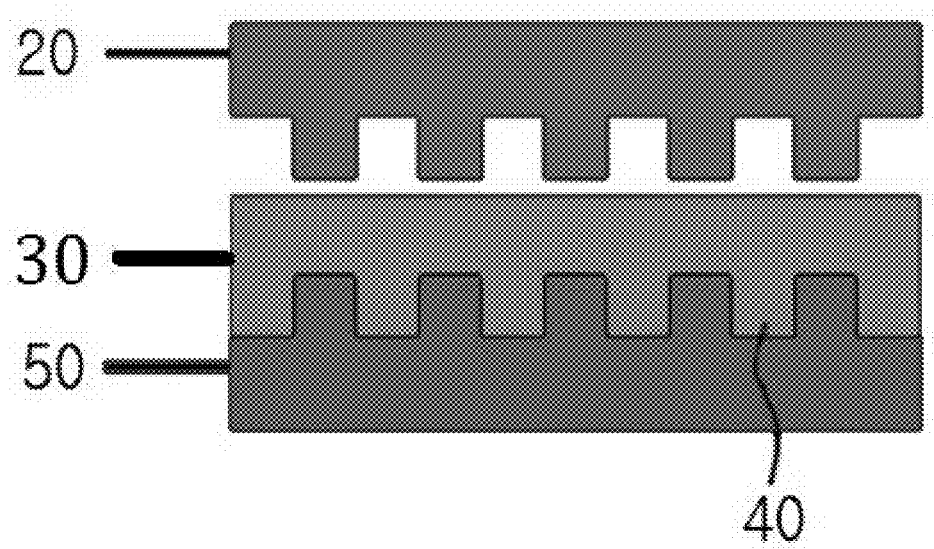

Then, as shown in FIG. 10, a second hot-embossing process for manufacturing the two-dimensional optical waveguide is performed.

The hot-embossing process by the original master 20 is additionally performed on a surface of the PMMA sheet 30 on which the buffer layer 50 does not exist.

At this time, the alignment key 21 within the original master 20 and an alignment key within the polymer pattern 40 manufactured by the imprinting process are used to control an interlayer position precision.

Also, the buffer layer 50 and the PMMA sheet 30 having the polymer pattern 40 are so transparent that an optical microscope may be used to realize the interlayer position control.

Figure 11:
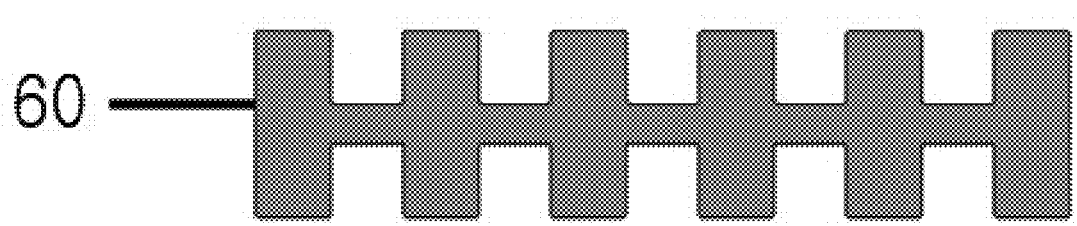

Then, as shown in FIG. 11, if the original master 20 and the buffer layer 50 are separated after the second hot-embossing process, a polymer mold 60 having patterns on both the surfaces thereof for manufacturing a two-dimensional optical waveguide is completed.

The polymer mold 60 manufactured as described above may be also used as an intermediate clad for the two-dimensional polymer optical waveguide by filling the channels on both the surfaces of the polymer mold 60 with a core resin.

A process for manufacturing a two-dimensional optical waveguide using the polymer mold 60 manufactured according to the process as described above will be described as follows.

FIGS. 12 to 20 are sectional views showing a process for manufacturing a two-dimensional polymer optical waveguide according to the present invention.

According to the process for manufacturing the two-dimensional polymer optical waveguide, a polymer mold is replicated to an elastic mold, and an ultraviolet exposure process is used to manufacture the final two-dimensional polymer.

Figure 12:
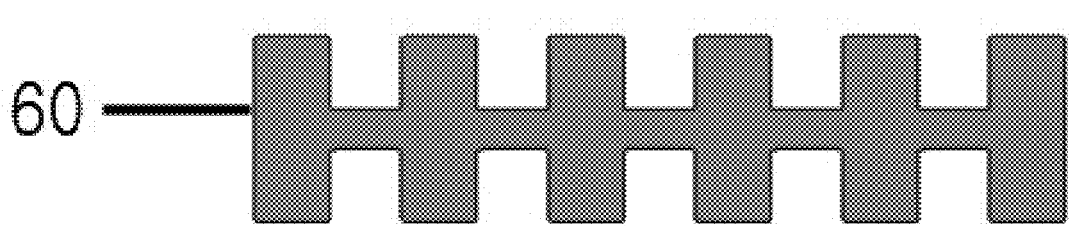
FIGS. 12 to 20 are sectional views showing a process for manufacturing a two-dimensional polymer optical waveguide according to the present invention.
Figure 13:
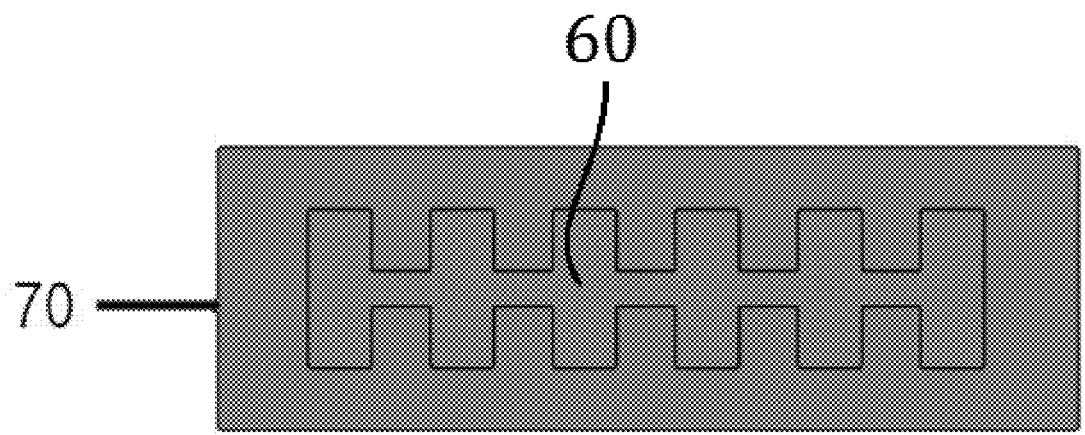

If the polymer mold 60 is manufactured as shown in FIG. 12, the whole shape of the polymer mold 60 manufactured by two imprinting processes is replicated into an elastic mold 70 by manufacturing a PDMS mold as shown in FIG. 13.

The thicknesses of upper and lower portions of the elastic mold 70 may function as a variable which may have an influence on the thickness of the intermediate clad of the final two-dimensional optical waveguide. Accordingly, in order to control the thickness of the elastic mold 70, the elastic mold 70 should be manufactured on a plane having an excellent planar uniformity to have a uniform thickness.

Figure 14:
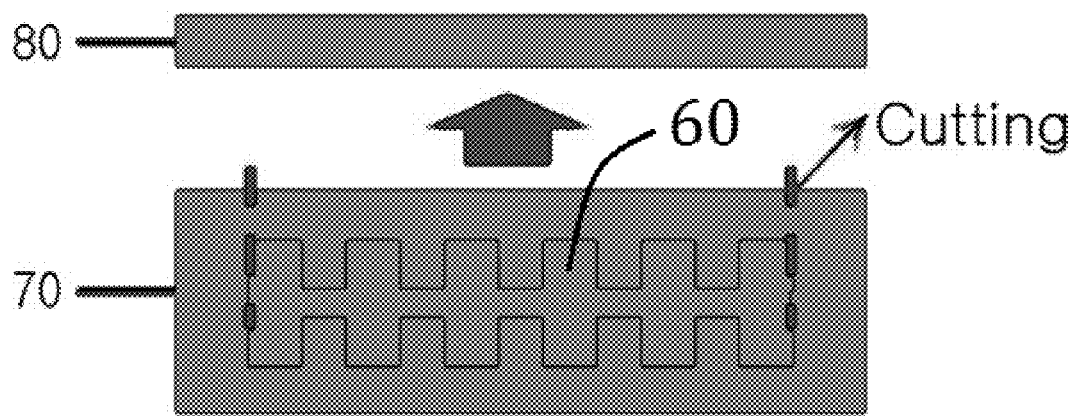

Then, as shown in FIG. 14, only an upper region of the elastic mold 70 is severed from a region in which the polymer mold 60 exists within the elastic mold 70, and the severed portion of the elastic mold is attached to another PDMA sheet or a glass plate 80.

Then, the polymer mold 60 is separated.

Figure 15:
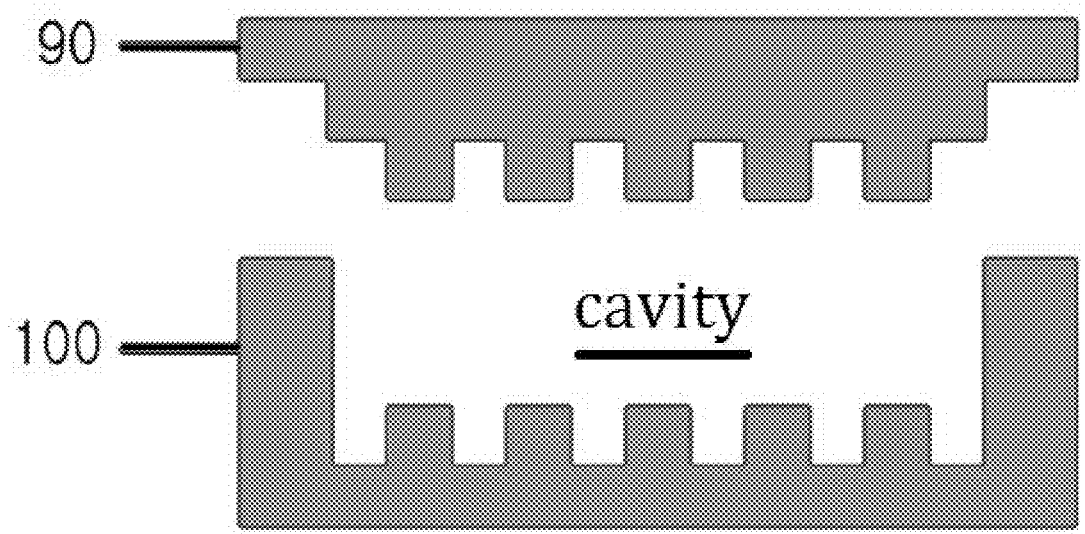

FIG. 15 shows a state in which the polymer mold 60 is separated. Finally, an upper elastic mold 90 having a pattern on an upper portion thereof and a lower elastic mold 100 having a cavity on a lower portion thereof are formed.

Figure 16:
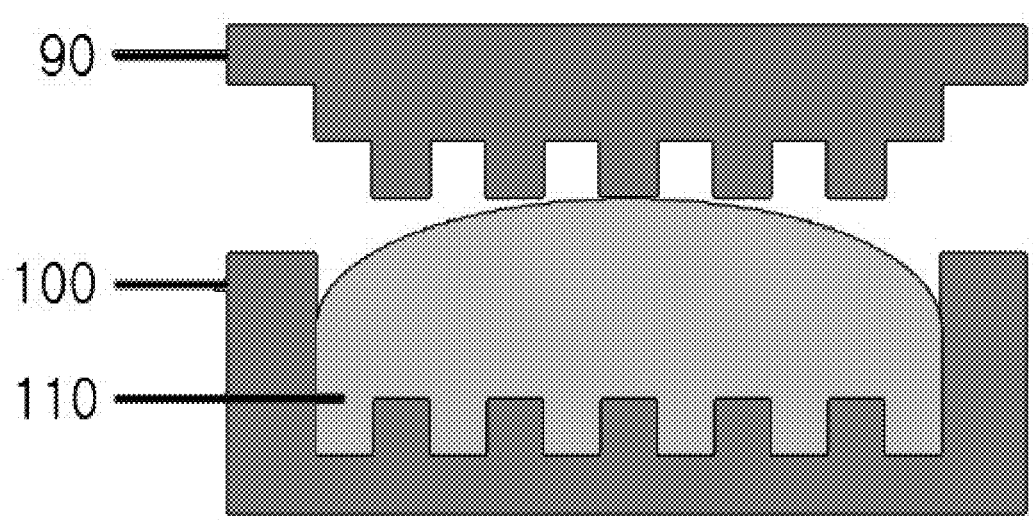

Then, as shown in FIG. 16, a cavity of the lower elastic mold 100 is filled with an ultraviolet curable resin 110, i.e., a polymer resin which may be cured by ultraviolet and is covered with the upper elastic mold 90.

At this time, since the upper elastic mold 90 and the lower elastic mold 100 were made of an identical material and initially integrated, they may be mated to each other.

Figure 17:
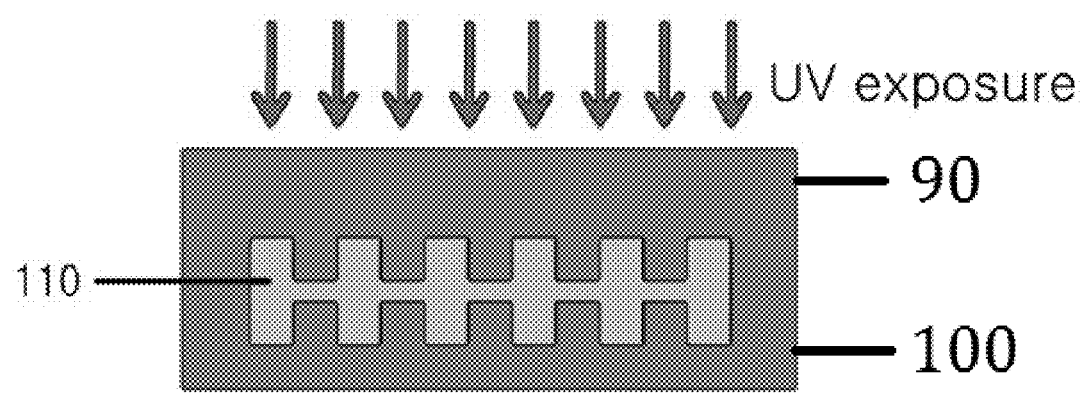

Then, as shown in FIG. 17, an ultraviolet exposure process is performed in a state where the upper elastic mold 90 and the lower elastic mold 110 are mated to each other.

The ultraviolet curable resin 110 initially in a liquid state is cured to a solid state by the ultraviolet exposure process.

Figure 18:
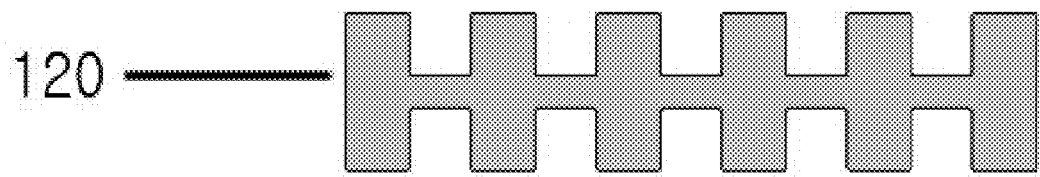

In addition, as shown in FIG. 18, the polymer pattern manufactured by the ultraviolet exposure process is used as an intermediate clad 120 according to the present invention. At this time, the intermediate clad 120 may be easily separated due to the elasticity and lower surface energy of the PDMS mold.

Further, the intermediate clad 120 manufactured in the present step is characterized by restoring the size and shape of the polymer mold 60 manufactured by the two hot-embossing processes.

Figure 19:
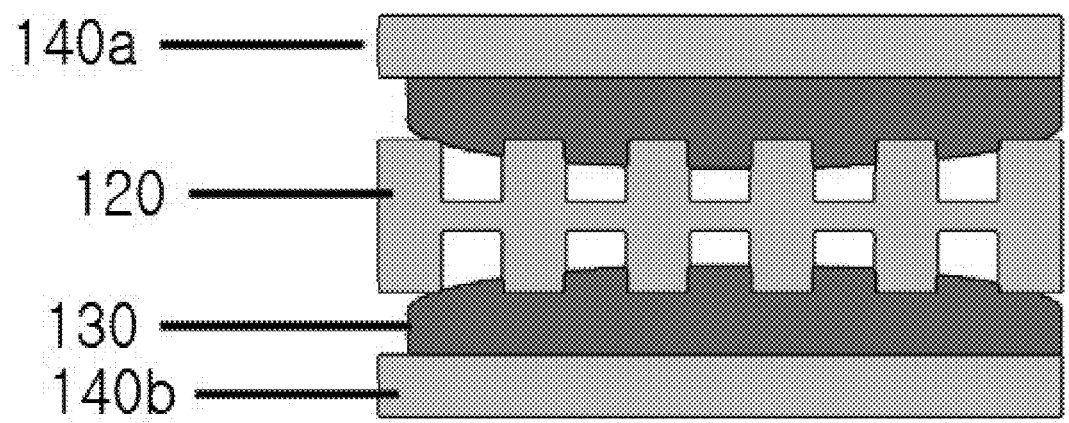

Then, as shown in FIG. 19, respective core regions on both the surfaces of the intermediate clad 120 are filled with an ultraviolet curable resin 130 having a refractive index higher than that of the intermediate clad 120, and upper and lower clads 140a and 140b having a refractive index equal to that of the intermediate clad 120 are stacked on the upper and lower surfaces of the intermediate clad 120, respectively.

Figure 20:
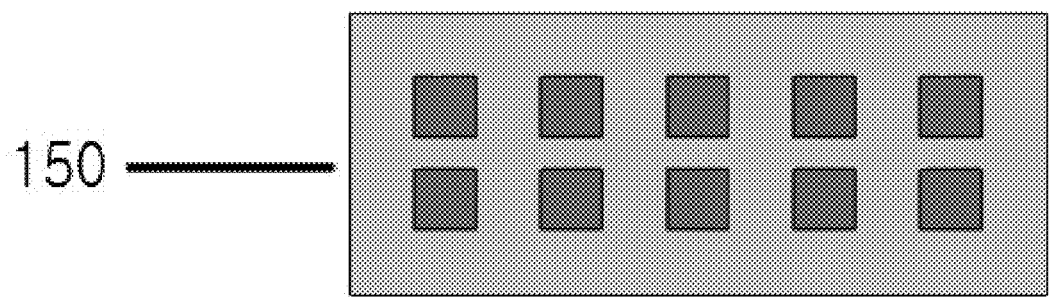

Then, FIG. 20 shows performing an ultraviolet exposure process on a sandwich structure of the upper clad 140a, the intermediate clad 120, the core resin, and the lower clad 140b. The UV curable resin 130, i.e., the core resin, is cured to completely manufacture a two-dimensional polymer optical waveguide 150.

Then, according to another embodiment of the method for manufacturing a two-dimensional optical waveguide according to the present invention, the polymer mold manufactured by the processes shown in FIGS. 6 to 11 may be directly used as the intermediate clad for manufacturing a two-dimensional polymer optical waveguide, so that a filling process of core channels of both the surfaces of the intermediate clad with a core resin may be performed, and upper and lower clads may be stacked, thereby manufacturing the two-dimensional polymer optical waveguide.

The method for manufacturing a two-dimensional optical waveguide according to the present invention as describe above may be used for manufacturing a two-dimensional optical waveguide through the simplified processes using the single imprint original master.

That is, precise two-dimensional polymer optical waveguides may be manufactured dozens of times using the upper and lower elastic molds manufactured by only one process without a process for manufacturing a two-dimensional polymer mold by a hot-embossing process.

To do this, the present invention generally includes the steps of: manufacturing a polymer mold for an intermediate clad, and manufacturing a two-dimensional optical waveguide using the polymer mold.

Here, the step of manufacturing a polymer mold for an intermediate clad includes the steps of: replicating a pattern of an original master onto a thermoplastic polymer sheet and forming a buffer layer on a surface of the replicated thermoplastic polymer pattern; and manufacturing a pattern on the other surface of the thermoplastic polymer sheet, on which there is no pattern, through a second hot-embossing process, in a state where the replicated thermoplastic polymer pattern to which the pattern of the original master is replicated is not separated from the buffer layer, thereby manufacturing a polymer mold for manufacturing a two-dimensional polymer optical waveguide.

Then, the step of manufacturing a two-dimensional optical waveguide using the polymer mold includes the steps of: replicating the whole shape of the manufactured polymer mold to an elastic mold, severing only an upper region of the elastic mold, in which the polymer mold exists, and removing the internal polymer mold; filling the elastic mold with an ultraviolet curable resin to manufacture an intermediate clad; and finally manufacturing a two-dimensional optical waveguide by a filling process of the intermediate clad with a core resin.

As described above, it may be understood that the present invention has been implemented as various modified embodiments without deviating the intrinsic features of the present invention.

Therefore, the embodiments as described above should be considered not in a limited viewpoint but in an illustrative viewpoint. The scope of the present invention is not limited to the embodiment described and illustrated above but is defined by the appended claims. It will be construed that the present invention includes all differences which ranges in the equivalent scope of the claims.

INDUSTRIAL APPLICABILITY

The present invention may be used for manufacturing a two-dimensional optical waveguide through simplified processes using a single imprint original master. Further, the present invention may be used for manufacturing a two-dimensional optical waveguide which may realize higher density and integration of the optical waveguide using a single imprint mold.

The invention claimed is:

1. A method for manufacturing a two-dimensional polymer optical waveguide, comprising the steps of:

preparing a single original master having a pattern thereon;
engraving the pattern of the single original master on a first surface of a thermoplastic polymer sheet through a first hot-embossing process using the single original master;
forming a buffer layer on the engraved pattern on the first surface of the thermoplastic polymer sheet;
engraving the pattern of the single original master on a second surface of the thermoplastic polymer sheet positioned opposite to the first surface through a second hot-embossing process using the single original master, thereby forming a first mold made of the thermoplastic polymer sheet; forming a second mold surrounding the first mold using an elastic material; separating the first mold from the second mold by dividing the second mold into an upper elastic mold and a lower elastic mold,
the upper elastic mold having the same pattern as that of the single original master and the lower elastic mold having the same pattern as that of the single original master;
forming an intermediate clad using the upper and lower elastic molds; and
forming a two-dimensional optical waveguide by filling upper and lower patterns of the intermediate clad with a core resin, stacking upper and lower clads, and then performing a curing process.

2. The method according to claim 1, wherein the thermoplastic polymer sheet is made of a PMMA (polymethyl methacrylate) sheet.

3. The method according to claim 1, wherein the step of forming the buffer layer comprises stacking a PDMS (polydimethylsiloxane) mold on the engraved pattern on the first surface as the buffer layer to control deformation of the engraved pattern on the first surface.

4. The method according to claim 1, wherein the single original master includes an alignment key,
wherein the step of engraving the pattern through the first hot-embossing process includes engraving the alignment key of the single original master on the first surface,
wherein the step of engraving the pattern through the second hot-embossing process includes aligning the alignment key of the original master and the engraved alignment key on the first surface to control an interlayer position precision before performing the second hot-embossing process.

5. The method according to claim 1, wherein the step of separating the first mold from the second mold comprises the steps of:
severing a part of an upper region of the second mold;
attaching the severed part of the second mold to another PDMS sheet or a glass plate such that the upper elastic mold is formed;
and then separating the first mold from the second mold, leaving a remaining portion of the second mold as the lower elastic mold.

6. The method according to claim 1, wherein the step of forming the intermediate clad comprises the steps of:
filling a cavity of the lower elastic mold with an ultraviolet curable resin and covering the lower elastic mold with the upper elastic mold to join the upper and lower elastic molds;
exposing the joined upper and lower elastic molds to ultraviolet light; and
separating the ultraviolet curable resin from the upper and lower elastic molds after the ultraviolet curable resin in a liquid state is cured to a solid state by the ultraviolet light.

7. The method according to claim 1, wherein the step of forming the two-dimensional optical waveguide further comprises: using an ultraviolet curable resin, as the core resin, having a refractive index higher than that of the intermediate clad; and wherein the upper and lower clads have a refractive index equal to that of the intermediate clad.

* * * * *